US009362400B1

(12) United States Patent  (10) Patent No.: US 9,362,400 B1
Cheng et al.  (45) Date of Patent: Jun. 7, 2016

(54) SEMICONDUCTOR DEVICE INCLUDING DIELECTRICALLY ISOLATED FINFETS AND BURIED STRESSOR

(71) Applicant: International Business Machines Corporation, Armonk, NY (US)

(72) Inventors: Kangguo Cheng, Schenectady, NY (US); Bruce B. Doris, Slingerlands, NY (US); Ali Khakifirooz, Los Altos, CA (US); Darsen D. Lu, Mount Kisco, NY (US); Alexander Reznicek, Troy, NY (US); Kern Rim, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/640,382

(22) Filed: Mar. 6, 2015

(51) Int. Cl.
*H01L 27/12* (2006.01)
*H01L 29/78* (2006.01)
*H01L 29/66* (2006.01)
*H01L 21/84* (2006.01)

(52) U.S. Cl.
CPC .......... *H01L 29/7843* (2013.01); *H01L 21/845* (2013.01); *H01L 27/1211* (2013.01); *H01L 29/66545* (2013.01); *H01L 29/7848* (2013.01)

(58) Field of Classification Search
CPC ..................... H01L 29/7848; H01L 29/66636; H01L 29/1054; H01L 29/785; H01L 29/66795; H01L 229/66545; H01L 21/76283
See application file for complete search history.

(56) References Cited

U.S. PATENT DOCUMENTS

| | | | |
|---|---|---|---|
| 7,138,302 B2 | 11/2006 | Xiang et al. | |
| 7,704,839 B2 | 4/2010 | Ieong et al. | |
| 8,115,254 B2 | 2/2012 | Zhu et al. | |
| 8,338,259 B2 | 12/2012 | Wu et al. | |
| 8,361,868 B2 | 1/2013 | Clifton | |
| 8,395,213 B2 | 3/2013 | Clifton et al. | |
| 8,492,235 B2 | 7/2013 | Toh et al. | |
| 2006/0286755 A1* | 12/2006 | Brask ................ H01L 29/42376 438/299 |
| 2007/0082492 A1* | 4/2007 | Kim ...................... H01L 21/318 438/694 |
| 2008/0185658 A1* | 8/2008 | Ieong ................ H01L 29/78696 257/369 |
| 2008/0286916 A1 | 11/2008 | Luo et al. | |
| 2012/0264261 A1 | 10/2012 | Zhu et al. | |
| 2013/0168804 A1 | 7/2013 | Zhu et al. | |
| 2013/0200468 A1 | 8/2013 | Cai et al. | |
| 2013/0249006 A1* | 9/2013 | Khakifirooz .......... H01L 27/088 257/368 |

FOREIGN PATENT DOCUMENTS

WO   2004040619 A2   5/2004

* cited by examiner

*Primary Examiner* — Khiem D Nguyen
(74) *Attorney, Agent, or Firm* — Cantor Colburn LLP; Vazken Alexanian

(57) ABSTRACT

A finFET semiconductor device includes a semiconductor-on-insulator (SOI) substrate including a buried insulator layer, a plurality of semiconductor fins on the buried insulator layer, and a gate structure covering the semiconductor fins, at least one buried stressor element embedded in the buried insulator layer, and a source/drain element on an upper surface of the at least one buried stressor element and integrally formed with at least one semiconductor fin among the plurality of semiconductor fins, the at least one buried stressor element applying a stress upon the source/drain element from therebeneath.

19 Claims, 9 Drawing Sheets

SEMICONDUCTOR DEVICE INCLUDING DIELECTRICALLY ISOLATED FINFETS AND BURIED STRESSOR

BACKGROUND

The present invention relates to semiconductor device, and more specifically, to fin-type field effect transistor (finFET) devices.

Semiconductor devices such as finFETs, for example, are known to include stressor elements to improve device performance. For instance, stressor elements are typically epitaxially grown on an upper surface of the bulk substrate reserved for forming source/drain elements, e.g., raised source/drain elements. The crystalline lattice differential between the stressor element (e.g., SiGe) and the underlying semiconductor material (e.g., Si) induces a strain on the source/drain element that allows for increased hole mobility therethrough to improve device performance, in the example case of a p-type FET or PFET device. However, epitaxially growing material from the upper surface of the substrate creates non-uniform and multi-crystalline raised source/drain elements. As a result, complications and process variations may occur during further processing due to the non-uniformity and seams between multiple single crystalline portions.

SUMMARY

According to at least one embodiment of the present invention, a finFET semiconductor device includes a semiconductor-on-insulator (SOI) substrate including a buried insulator layer, a plurality of semiconductor fins on the buried insulator layer, and a gate structure covering the semiconductor fins, at least one buried stressor element embedded in the buried insulator layer, and a source/drain element on an upper surface of the at least one buried stressor element and integrally formed with at least one semiconductor fin among the plurality of semiconductor fins, the at least one buried stressor element applying a stress upon the source/drain element from therebeneath.

According to another embodiment of the present invention, a method of fabricating a finFET device includes forming a semiconductor substrate including at least one insulator portion, forming at least one semiconductor fin on the insulator portion, and forming a gate structure on the at least one semiconductor fin and between designated regions of the semiconductor substrate reserved for source/drain elements, forming at least one buried stressor element within the insulator portion located in at least one of the designated regions, and forming a source/drain element on an upper surface of the at least one buried stressor element such that the at least one buried stressor element induces a stress upon the source/drain element from therebeneath.

Additional features are realized through the techniques of the present invention. Other embodiments are described in detail herein and are considered a part of the claimed invention. For a better understanding of the invention with the features, refer to the description and to the drawings.

BRIEF DESCRIPTION OF THE DRAWINGS

The subject matter which is regarded as the invention is particularly pointed out and distinctly claimed in the claims at the conclusion of the specification.

FIGS. 1A-7 are a series of views illustrating a method of forming a finFET device according to exemplary embodiments of the present teachings, in which:

FIG. 1A is a perspective view of an intermediate finFET device including a gate structure formed on a semiconductor-on-insulator (SOI) substrate and extending along an X-axis to define a width, a Y-axis to define a height, and a Z-axis to define a length according to a non-limiting embodiment of the invention;

FIG. 2 illustrates the finFET device shown in FIGS. 1A-1B taken along line A-A' to show a portion of the gate structure on a semiconductor fin;

FIG. 3 illustrates the finFET device shown in FIG. 2 after partially recessing a spacer of the gate structure along the width-direction to expose the upper surface of the buried insulator layer;

FIG. 4 illustrates the finFET device shown in FIG. 3 after recessing the height of the exposed the buried insulator layer to form a cavity therein;

FIG. 5 illustrates the finFET device shown in FIG. 4 after recessing the exposed the buried insulator layer along the width-direction to extend the cavity beneath the semiconductor fin and the spacer of the gate structure;

FIG. 6 illustrates the finFET device shown in FIG. 5 after filling the cavity with a dielectric material to form a buried stressor element within the buried insulator layer;

FIG. 7 illustrates the finFET device shown in FIG. 6 after epitaxially growing a source/drain element on an upper surface of the buried stressor element and on the exposed portion of the semiconductor fin.

DETAILED DESCRIPTION

Various non-limiting embodiments of the invention provide a finFET including one or more stressor elements embedded within an insulator portion of the substrate. Unlike conventional finFETs that include stressor elements formed on the upper surface of the semiconductor substrate, one or more stressor elements according to at least one embodiment of the invention provides a stress on a semiconductor fin from beneath the source/drain region. In this manner, a uniaxial stress, for example, is applied to a bottom portion of the source/drain region of the semiconductor fin to improve finFET performance. Moreover, conventional stressor elements can be formed on an upper surface of the substrate reserved for a source/drain element, in combination with the inventive buried stressor elements. Accordingly, at least one embodiment of the invention provides a finFET having enhanced hole mobility through the source/drain region.

Figure 1A:
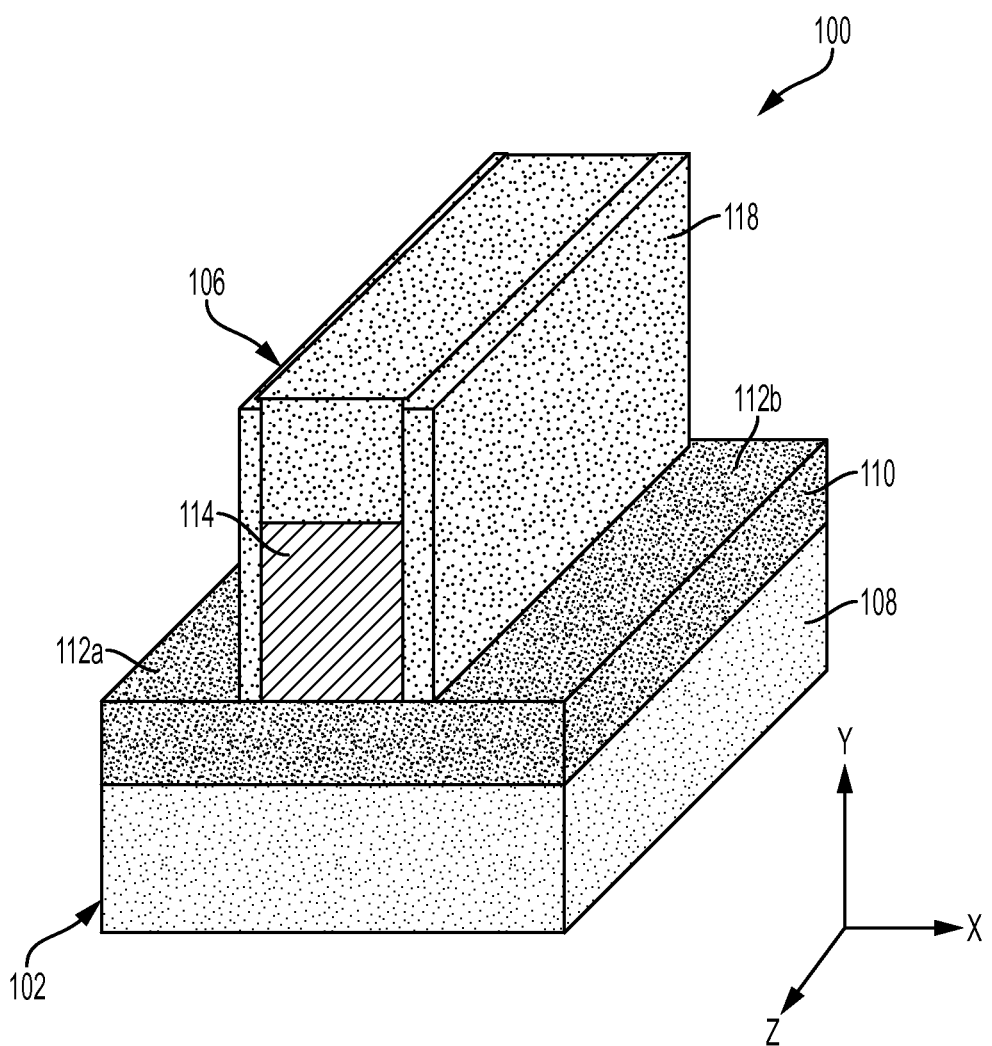
Figure 1B:
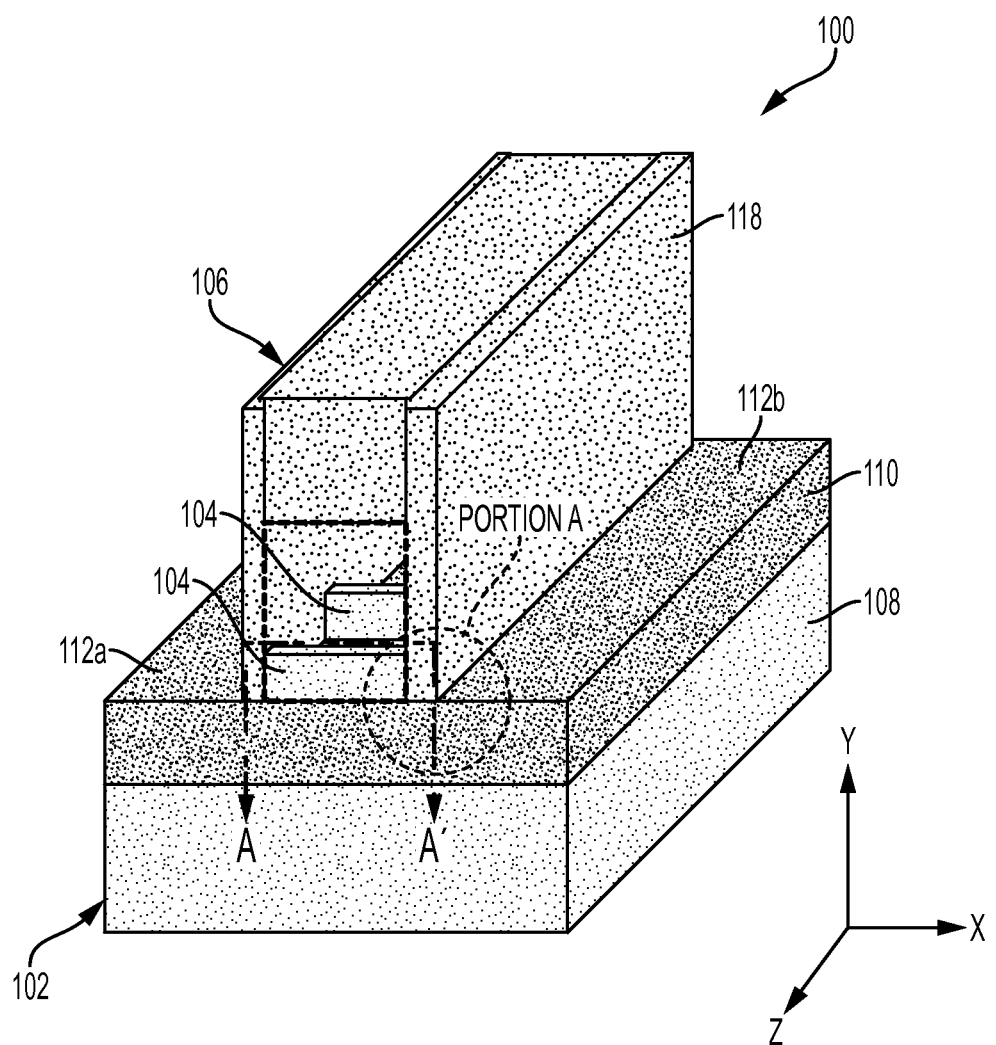
FIG. 1B is a second view of the finFET device illustrating a transparent dummy gate to show a plurality of semiconductor fins formed on a buried insulator layer of the SOI substrate.

With reference now to FIGS. 1A-1B, an intermediate semiconductor device 100 such as, for example, an intermediate finFET device 100, is illustrated according to a non-limiting embodiment of the invention. In the present specification and claims, an "intermediate" semiconductor device is defined as a semiconductor device in a stage of fabrication prior to a final stage. The finFET device 100 includes a semiconductor-on-insulator (SOI) substrate 102, a plurality of semiconductor fins 104 formed on an upper surface of the SOI substrate 102 (see FIG. 1B), and a gate structure 106 formed on an upper surface of the SOI substrate 102 to cover the plurality of semiconductor fins 104. The SOI substrate 102 includes a bulk substrate layer 108 and a buried insulator layer 110 formed on an upper surface of the bulk substrate layer 108. Accordingly, the buried insulator layer 110 is interposed between the plurality of semiconductor fins 104 and the bulk substrate layer 108, as further illustrated in FIG. 1B.

Still referring to FIGS. 1A and 1B, the SOI substrate 102 extends along a first axis (i.e., an X-axis) to define a width, a second axis (i.e., a Y-axis) to define a length, and a third axis (i.e., a Z-axis) to define a height. The bulk substrate layer 108 comprises, for example, silicon (Si), and the buried insulator layer 110 comprises various insulator materials including, but not limited to, silicon oxide ($SiO_2$). The buried insulator layer 110 can have a thickness ranging from, for example, about 120 nanometers (nm) to about 140 nanometers. The semiconductor fins 104 (see FIG. 1B) comprise a semiconductor material including, but not limited to, silicon (Si). The semiconductor fins 104 have a pitch ranging from approximately 40 nm to approximately 42 nm, for example, and can be formed using various masking and etching techniques as understood by one of ordinary skill in the art.

The gate structure 106 is formed on an upper surface of the buried insulator layer 110 and at approximately the center of the SOI substrate 102 to cover the semiconductor fins 104. Accordingly, the gate structure 106 is interposed between a first substrate region 112a reserved for a first source/drain (SD) element (not shown in FIG. 1A) and a second substrate region 112b reserved for a second SD element (not shown in FIG. 1A). The gate structure 106 includes a dummy gate 114 formed on an upper surface of the buried insulator layer 110 and the semiconductor fins 104, and a gate cap 116 formed on an upper surface of the dummy gate 114. A gate spacer 118 is formed on opposing walls of the dummy gate 114 and the gate cap 116, and can have an initial width ranging, for example, from approximately 6 nm to approximately 8 nm. The dummy gate 114 may include various sacrificial materials including, but not limited to, polycrystalline silicon, amorphous silicon, or microcrystal silicon. The gate cap 116 and gate spacers 118 may include a low dielectric (low-k) material such as, for example, silicon nitride (SiN), silicon boron carbonitride (SiBCN), or silicon oxide carbonitride (SiOCN). Although not illustrated, it is appreciated that a dummy gate oxide film may be interposed between the dummy gate 114 and the buried insulator layer 110 as understood by one of ordinary skill in the art.

Figure 2:
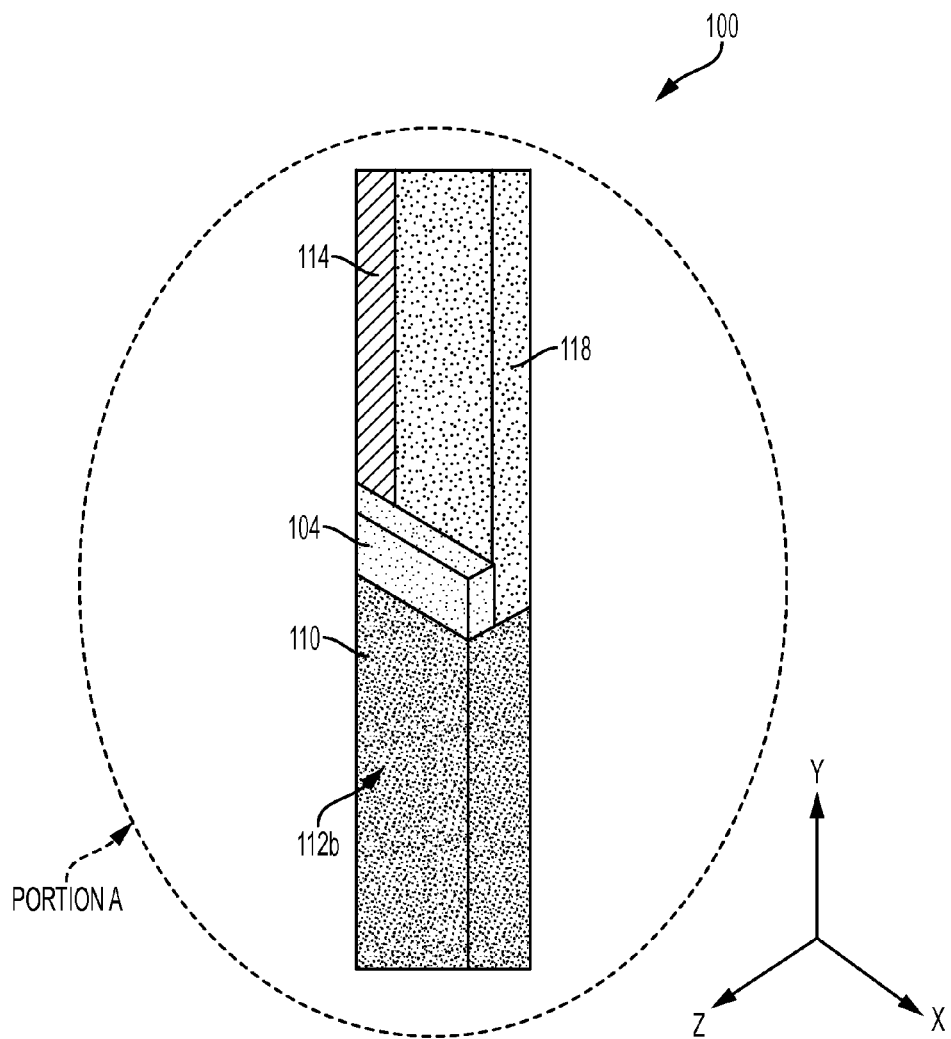

Turning now to FIGS. 2-8, a cross-sectional view of the finFET device 100 taken along line A-A' is shown and a portion of the cross-section (portion A) will be discussed in greater detail. Although only a portion of the finFET device 100 is shown, it should be appreciated that the process flow described in detail below can be applied to other areas/portions of the finFET 100. At an intermediate step of the process flow, one or more semiconductor fins 104 are formed on the buried insulator layer 110. The dummy gate 114 and the gate spacer 118 formed on the outer surface of the semiconductor fin 104 as illustrated in FIG. 2.

Figure 3:
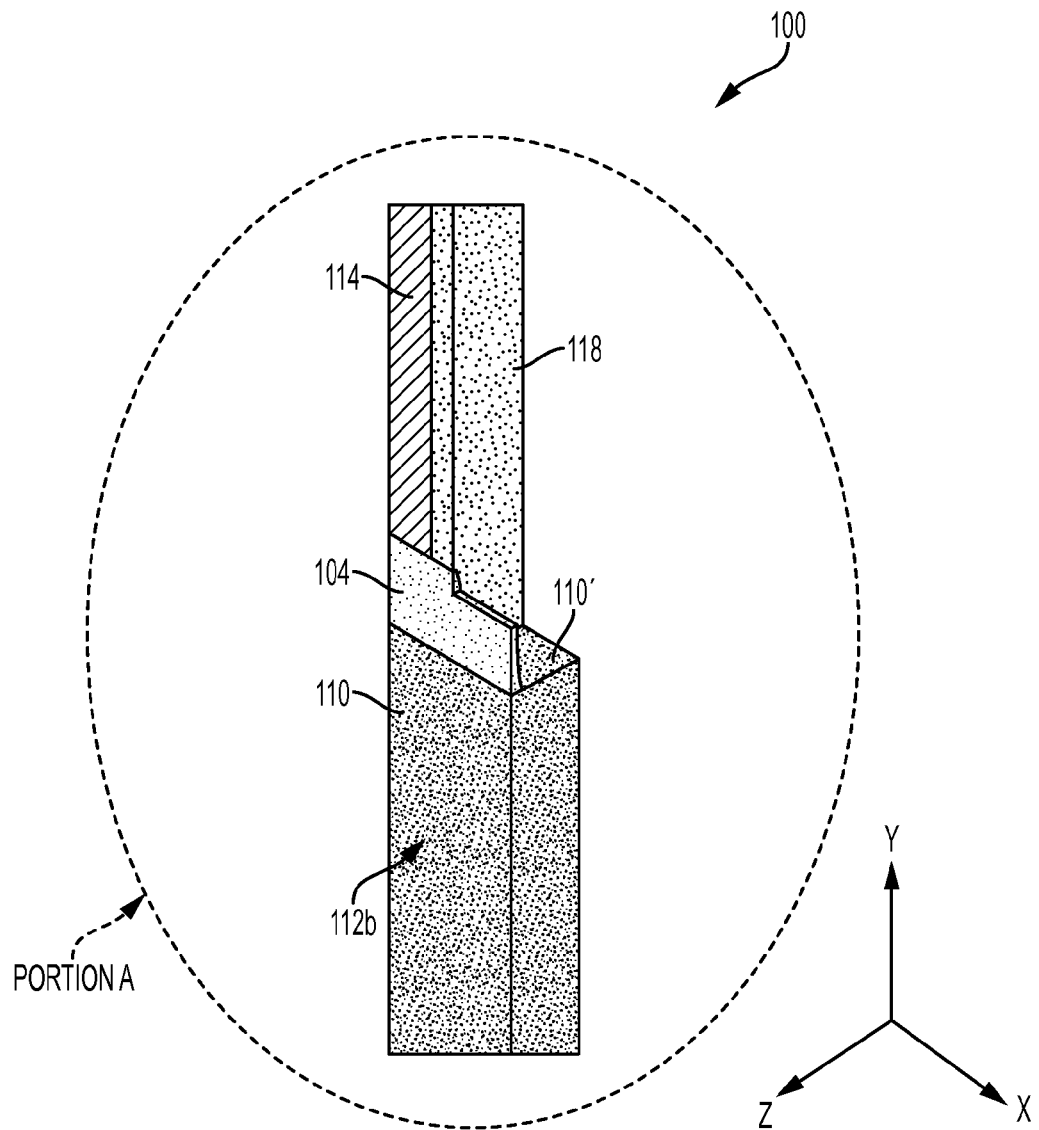

Referring to FIG. 3, a first etching process is performed to recess a portion of the gate spacer 118 along the width direction (i.e., X-axis). An isotropic etch that is selective to the insulator material (e.g., $SiO_2$) of the buried insulator layer 110 and selective to a semiconductor material of the fin 104 (e.g., Si) can be used to recess the gate spacer 118 in the width direction. Accordingly, a portion of the buried insulator layer 110' located in the source/drain region 112b is exposed as further illustrated in FIG. 3.

Figure 4:
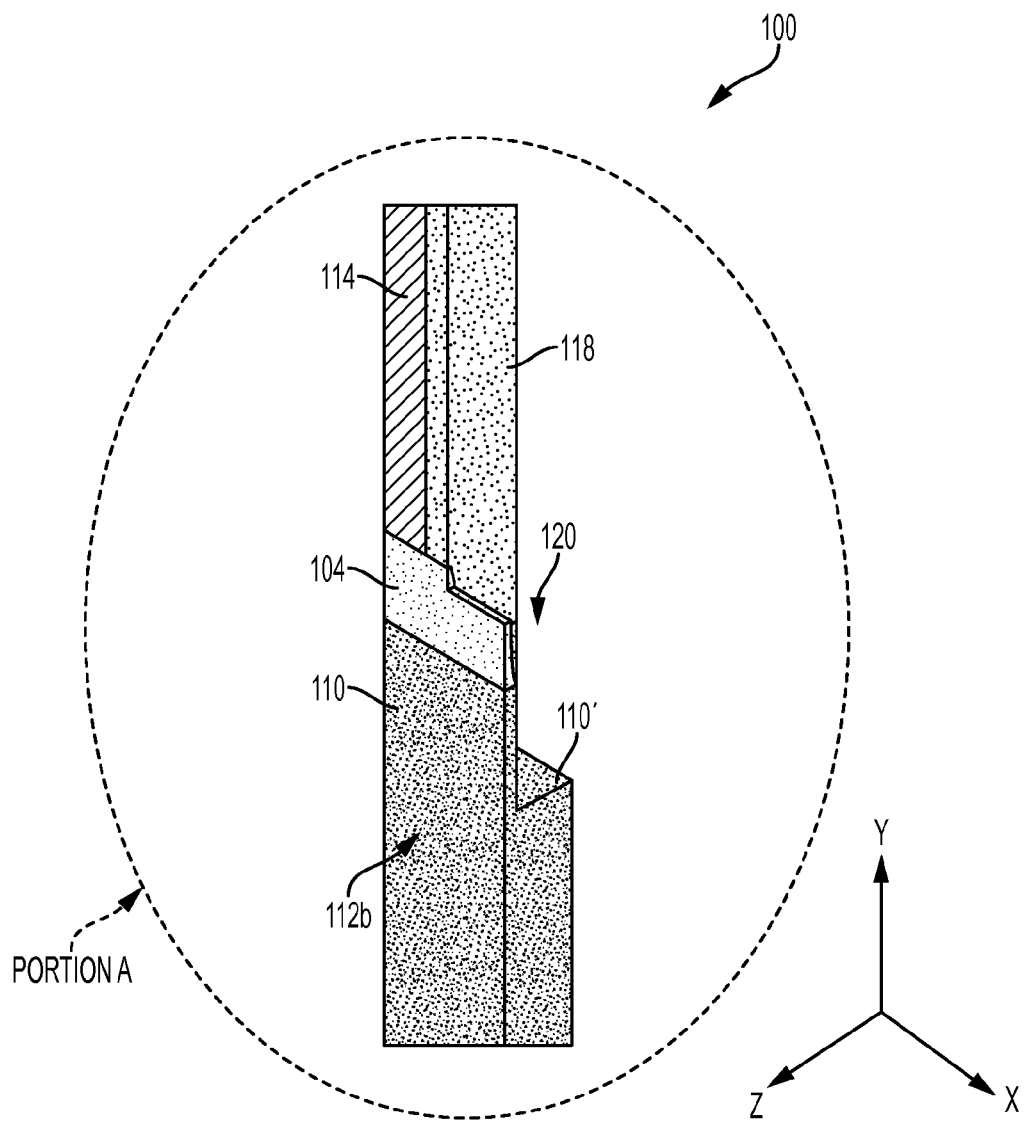

Turning to FIG. 4, an anisotropic etch process is performed to recess a first portion of the exposed portion of the buried insulator layer 110' located in the source/drain region 112b below the semiconductor fin 104 and the gate spacer 118. A reactive ion etch (RIE) selective to the semiconductor material (e.g., Si) of the semiconductor fin 104 can be used to recess the exposed portion of the buried insulator layer 110'.

Figure 5:
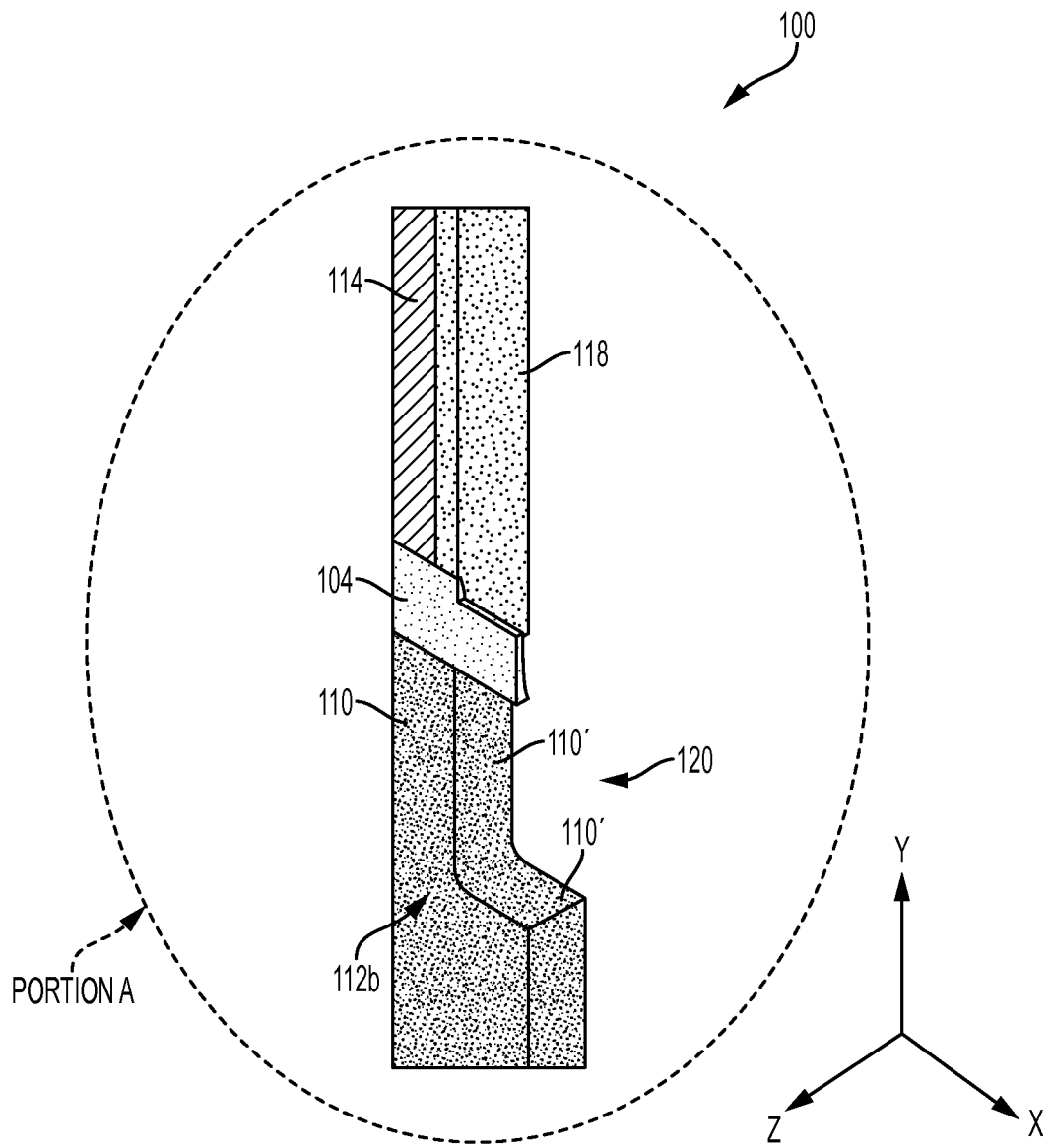

Referring now to FIG. 5, a second isotropic etch process is used to recess a second portion of the buried insulator layer 110' located in the source/drain region 112b along the width direction (i.e., the X-axis). The second isotropic etch process is, for example, an RIE that is selective to the semiconductor material (e.g., Si) of the semiconductor fin 104. Accordingly, a cavity 120 is formed in the second substrate region 112b. The cavity 120 extends beneath the semiconductor fin 104 and the gate spacer 118. The dimension of the cavity 120 may comprise a height of approximately 50 nanometers, for example, and a width of approximately 22 nanometers, for example. Moreover, the cavity 120 is formed beneath a portion of the originally formed semiconductor fin 104. That is, it not necessary to completely etch away the exposed portion of the semiconductor fin 104 in order to form the cavity 120.

Figure 6:
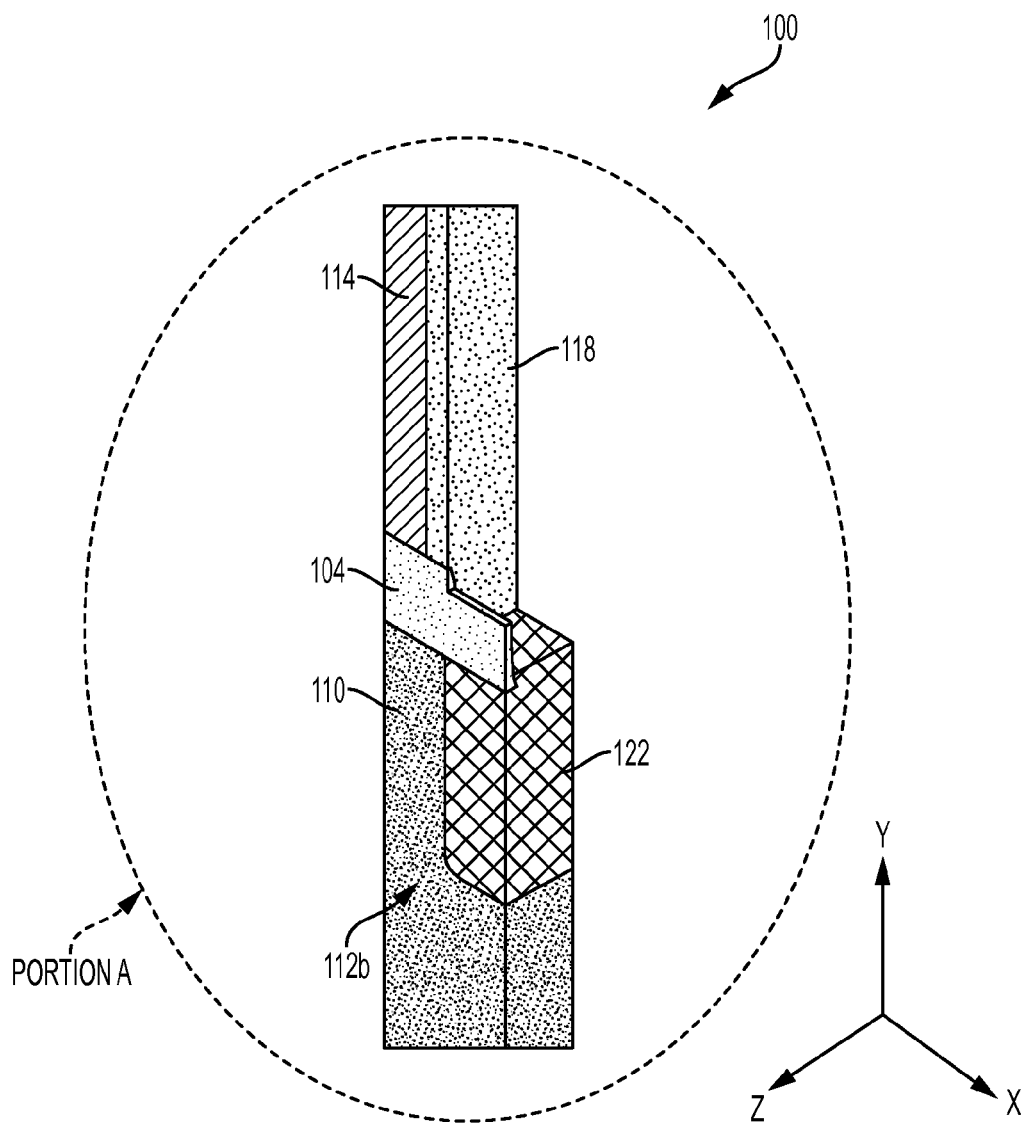

Turning now to FIG. 6, the cavity 120 is filled with a dielectric material to form a buried stressor element 122. Various deposition methods can be used to fill the cavity 120 including, but not limited to, chemical vapor deposition (CVD) and atomic layer deposition (ALD). Accordingly, the buried stressor element 122 is embedded in a portion of the buried insulator layer 110 and aligned (e.g., vertically aligned) with a source/drain region of the semiconductor fin 104. Various dielectric materials that induce a tensile or compressive strain on semiconductor materials may be used. For example, the dielectric material may comprise silicon nitride (SiN). It is appreciated that at least one embodiment of the invention allows the buried stressor element 122 to be formed beneath a portion of the originally formed semiconductor fin 104. That is, the exposed semiconductor fin 104 is not required to be completely etched away in order to form cavity 120. Therefore, it is not necessary to re-form (e.g., re-grow) the entire semiconductor fin 104 after forming the buried stressor element 122.

Although not illustrated, the dielectric material may be blanket deposited in the cavity 120 and on the outer surfaces of the semiconductor fin 104 and gate spacer 118. The excess dielectric material may then be recessed below the semiconductor fin 104 using an etching process selective to semiconductor material such as, for example, silicon (Si), to form the buried stressor element 122 in the buried insulator layer 110.

According to a non-limiting embodiment, a thin high-k liner (not shown) can be deposited on the outer surface of the spacer 118 and the surface of the cavity 120. The high-k liner can comprise hafnium oxide ($HfO_2$), for example, and can have a thickness of, for example, approximately 2 nm to approximately 3 nm. The dielectric material can then be blanket deposited in the cavity 120 and on the gate spacer 118, and then recessed to form the buried stressor element 122 as described in greater detail above. After forming the buried stressor element 122, the high-k liner can be removed from gate spacer 118 using an etching process selective to the gate spacer material and the buried stressor element material. Accordingly, a portion of the high-k liner remains at an interface between the buried stressor element 122 and the buried insulator layer 110.

Figure 7:
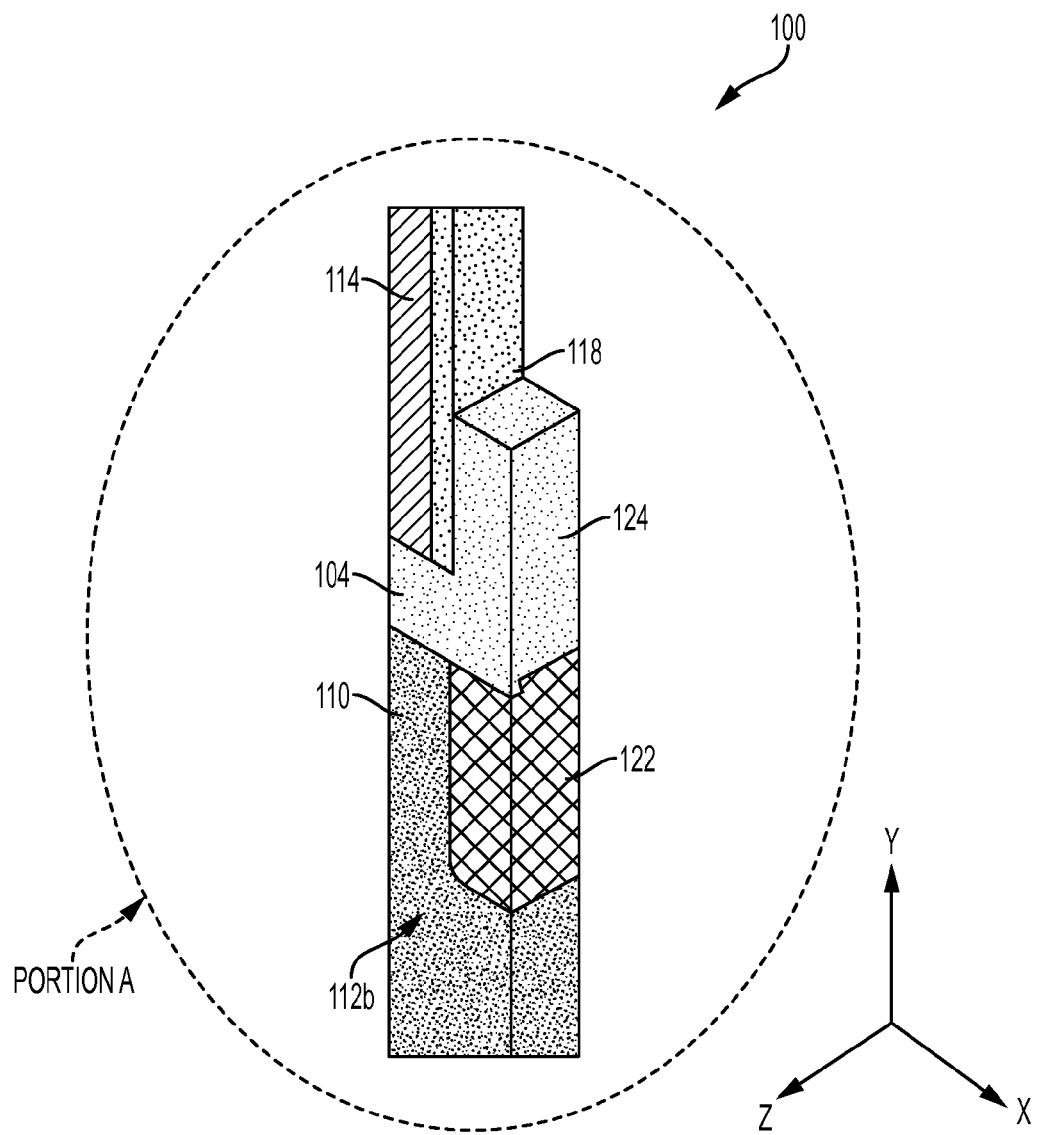

Turning now to FIG. 7, a SD element 124 is epitaxially grown from the upper surface of the buried stressor element 122 and on the outer surface of the gate spacer 118. As a result, the SD element 124 is formed integrally with the semiconductor fin 104. The SD element 124 can have a thickness ranging, for example, from approximately 20 nm to approximately 25 nm, and a height ranging, for example, from approximately 5 nm to approximately 25 nm. The SD element 124 may be formed from various epitaxial materials. For example, when forming the finFET device 100 as an nFET, the SD element 124 may include phosphorous-doped silicon (SiP), or phosphorous-doped silicon carbide (SiCP). In this manner, the stressor element 124 induces a tensile strain/stress on the SiP or SiCP SD element 124 from therebeneath. When, however, the finFET device 100 is formed as a pFET, the SD element 124 may include boron-doped silicon (SiB) or silicon germanium (SiGe). In this manner, the stressor element 124 induces a compressive strain/stress on the SiB or SiGe SD element 124 from therebeneath. The stress level depends on the intrinsic stress of the buried stressor. Since the buried stressor element 122 in either instance is formed beneath the SD element 124, the buried stressor element 122 induces a stress profile with a higher stress ranging from about $2*10^9$ pascals (Pa) near the bottom of the semiconductor fin 104 (i.e., the interface between the buried stressor element 122 and the SD element 124) and a lower stress of about $5*10^8$ Pa near the top of the semiconductor fin 104 as discussed in greater detail below It should be appreciated, however, that higher or lower stresses may be achieved.

Figure 8:
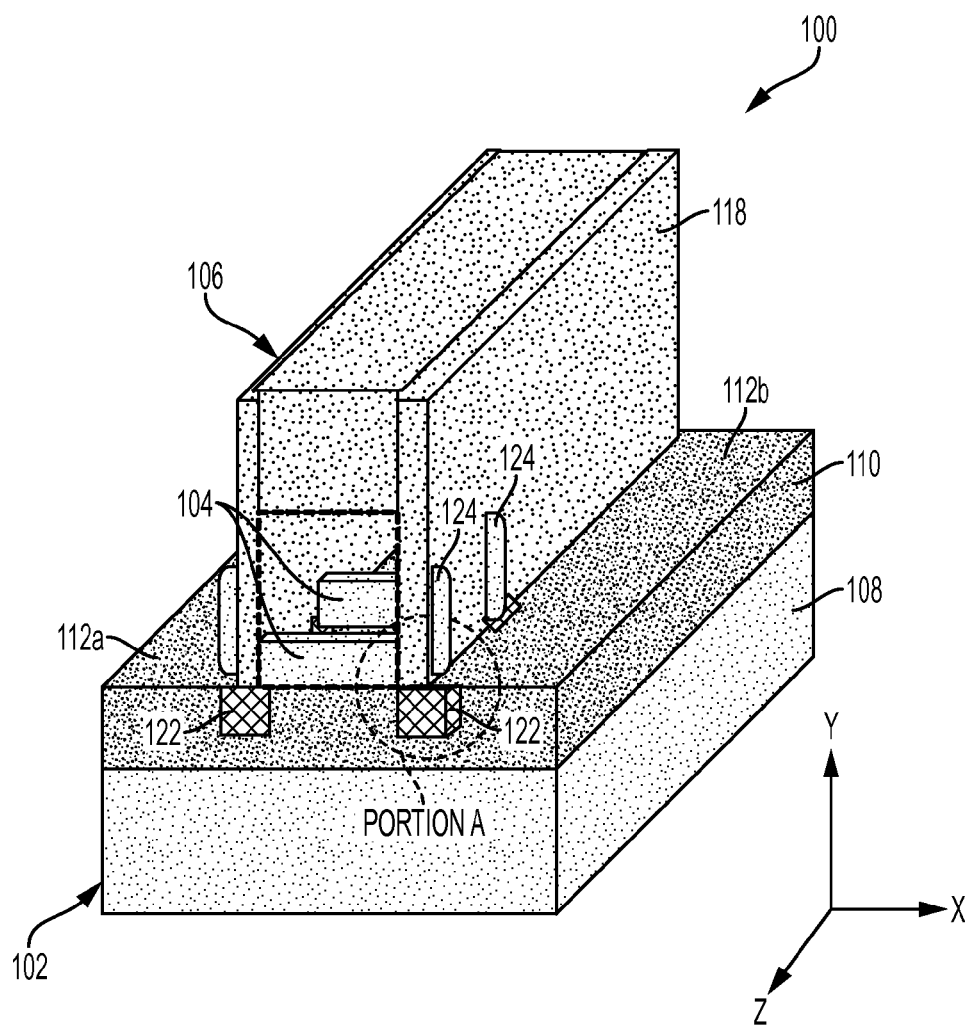
FIG. 8 illustrates a completed finFET device including buried stressor elements embedded in a portion of the buried insulator layer of the substrate reserved for source/drain elements, and source/drain elements integrated with edge portions of the semiconductor fins.

Referring to FIG. 8, a finFET device 100 including a plurality of buried stressor elements 122 embedded in substrate regions 112a-112b reserved for SD elements 124 is illustrated according to a non-limiting embodiment. Each buried stressor element 122 is embedded within the buried insulator layer 110 and beneath first and second portions of each semiconductor fin 104. Although not illustrated, it should be appreciated that the finFET device 100 may undergo further fabrication processes including, but not limited to, contact formation at substrate regions 112a-112b, and replacement metal gate processes as understood by one of ordinary skill in the art.

Unlike conventional finFET devices that include a surface stressor element epitaxially grown from an upper surface of the substrate, at least one embodiment of the invention provides a finFET device includes a buried stressor element 122 embedded in a buried insulator layer 110 of an SOI substrate 102, and beneath a portion of the semiconductor fin in regions of the substrate 112a-112b reserved for source/drain elements 124. In this manner, the buried stressor element 122 induces a stress profile (e.g., uniaxial stress) from beneath the source/drain r elements 124. Moreover, the buried stressor element 122 induces a stress profile with a higher stress near the bottom of the semiconductor fin 104/SD element 124 and a lower stress near the top of the semiconductor fin 104/SD element 124. Such a stress profile provided by at least one embodiment of the invention is therefore opposite to typical stress profiles created by conventional silicon germanium or silicon carbon stressor elements epitaxially grown on the upper surface of the source/drain regions, which apply a stress from the top surface of the substrate.

In addition, at least one embodiment of the invention allows for epitaxially growing a SiGe or SiC surface stressor element on the upper surface of the SD element 124. Accordingly, a combination of a buried stressor element 122 and a surface stressor element (not shown) can be implemented to increase hole/electron mobility through the source/drain region, thereby improving device performance over what is currently achieved by finFETs using only conventional surface stressor elements. The combined stress of the buried stressor and the SiGe or SiC surface stressor element produces increased strain in the channel of finFET, thereby improving the performance of the device.

Although not illustrated, it should be appreciated that one or more process flow operations of the invention described in detail above may be applied to bulk substrate finFET devices (not shown). For example, the bulk substrate finFET device includes a plurality of fins formed on an upper surface of a semiconductor substrate (e.g., a silicon substrate). Each semiconductor fin includes a respective insulator layer interposed between the fin and the semiconductor substrate. Accordingly, a portion of each individual insulator layer can be selectively etched to form a cavity that extends beneath a portion of the fin located in the source/drain region of the semiconductor substrate. The cavity can be filed with a dielectric material to form a buried stressor element that is embedded in each individual insulator layer and is located between the base of the fin and the bulk semiconductor substrate. An SD element is epitaxially grown from the buried stressor element and is integrated with a portion of the original semiconductor fin. In this manner, a finFET device formed on a bulk semiconductor substrate includes buried stressor elements disposed beneath each fin and embedded in a portion of insulator layer located in the source/drain region.

As used herein, the term module refers to a hardware module including an Application Specific Integrated Circuit (ASIC), an electronic circuit, a processor (shared, dedicated, or group) and memory that execute one or more software or firmware programs, a combinational logic circuit, and/or other suitable components that provide the described functionality.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the inventive teachings and the practical application, and to enable others of ordinary skill in the art to understand the invention for various embodiments with various modifications as are suited to the particular use contemplated.

The flow diagrams depicted herein are just one example. There may be many variations to this diagram or the operations described therein without departing from the spirit of the invention. For instance, the operations may be performed in a differing order or operations may be added, deleted or modified. All of these variations are considered a part of the claimed invention.

While various embodiments have been described, it will be understood that those skilled in the art, both now and in the future, may make various modifications which fall within the scope of the claims which follow. These claims should be construed to maintain the proper protection for the invention first described.

What is claimed is:

1. A finFET semiconductor device, comprising:
a semiconductor-on-insulator (SOI) substrate including a buried insulator layer, a plurality of semiconductor fins on the buried insulator layer, and a gate structure covering the semiconductor fins;
at least one buried stressor element embedded in the buried insulator layer; and
a source/drain element formed directly on an upper surface of the at least one buried stressor element and integrally formed with at least one semiconductor fin among the plurality of semiconductor fins, the at least one buried stressor element applying a stress upon the source/drain element from therebeneath.

2. The finFET semiconductor device of claim 1, wherein the buried stressor element induces a stress profile such that a stress at a base portion of the source/drain element contacting the buried stressor element is higher than a stress at an upper portion of the source/drain element opposite the base portion.

3. The finFET semiconductor device of claim 2, wherein the at least one buried stressor element extends beneath the at least one semiconductor fin.

4. The finFET semiconductor device of claim 3, wherein the gate structure includes a spacer, and wherein the at least one source/drain element directly contacts each of the spacer, the semiconductor fin, and the buried stressor layer.

5. The finFET semiconductor device of claim 4, wherein the buried stressor element comprises a dielectric material.

6. The finFET semiconductor device of claim 5, wherein the at least one source/drain element comprises a strain-inducing material selected from the group comprising silicon germanium (SiGe), boron-doped silicon (SiB), phosphorous-doped silicon (SiP), and phosphorous-doped silicon carbide (SiCP).

7. The finFET semiconductor device of claim 6, wherein the at least one source/drain element comprises one of silicon germanium (SiGe) or boron-doped silicon (SiB) such that the at least one buried stressor element induces a compressive stress on the at least one source/drain element.

8. The finFET semiconductor device of claim 6, wherein the at least one source/drain element comprises one of phosphorous-doped silicon (SiP) or phosphorous-doped silicon carbide (SiCP) such that the buried stressor element induces a tensile stress on the at least one source/drain element.

9. The finFET semiconductor device of claim 6, wherein the buried stressor element comprise silicon nitride (SiN).

10. The finFET semiconductor device of claim 9, wherein the spacer comprises siliconborocarbonitride (SiBCN).

11. The finFET semiconductor device of claim 1, wherein the at least one buried stressor element is beneath both the source/drain element and the at least one semiconductor fin.

12. A method of fabricating a finFET device, the method comprising:
forming a semiconductor substrate including at least one insulator portion, wherein the semiconductor substrate is a semiconductor-on-insulator substrate including a buried insulator layer;
forming at least one semiconductor fin on the insulator portion, and forming a gate structure on the at least one semiconductor fin and between designated regions of the semiconductor substrate reserved for source/drain elements, the gate structure including first and second opposing spacers, and a dummy gate interposed between the first and second dummy gate spacers;
forming at least one buried stressor element within the insulator portion located in at least one of the designated regions; and
forming a source/drain element on an upper surface of the at least one buried stressor element such that the at least one buried stressor element induces a stress upon the source/drain element from therebeneath,
wherein forming the at least one buried stressor element comprises:
etching a portion of at least one of the first and second gate spacers to expose an underlying portion of the buried insulator layer located in the at least one designated region reserved for a source/drain region;
etching the exposed portion of the buried insulator layer to form a cavity in the designated region; and
filling the cavity with a dielectric material to form the at least one buried stressor element within a portion of the buried insulator layer located in the designated region.

13. The method of claim 12, wherein the at least one semiconductor fin includes a plurality of semiconductor fins formed on the buried insulator layer.

14. The method of claim 13, further comprising forming the at least one buried stressor element beneath a portion of a respective semiconductor fin located in the designated region.

15. The method of claim 14, wherein forming the source/drain element comprises epitaxially growing the source/drain element on the buried stressor element and the respective semiconductor fin.

16. The method of claim 12, wherein etching the exposed portion of the buried insulator layer further comprises:
performing an anisotropic etching process to recess a first portion of the of the exposed buried insulator layer in a first direction to extend the cavity below the gate spacer; and
after performing the anisotropic etching process, performing an isotropic etching process to recess a second portion of the exposed buried insulator layer in a second direction opposite the first direction to extend the cavity beneath the at least one semiconductor fin.

17. The method of claim 16, wherein the anisotropic etching process and the isotropic etching process are each selective to a material of the semiconductor fin and a material of the gate spacer.

18. The method of claim 17, wherein a material of the buried stressor element is selected from a group comprising silicon germanium (SiGe) and boron-doped silicon (SiB) such that the at least one buried stressor element induces a compressive stress on the at least one source/drain element.

19. The method of claim 17, wherein a material of the buried stressor element is selected from a group comprising phosphorous-doped silicon (SiP) such that the buried stressor element induces a tensile stress on the at least one source/drain.

* * * * *